United States Patent
Hsu et al.

(10) Patent No.: US 7,001,784 B2
(45) Date of Patent: Feb. 21, 2006

(54) METHOD TO CONTROL SPACER WIDTH

(75) Inventors: Jyh-Shiou Hsu, Hsin-Chu (TW); Pin-Yi Hsin, Hsin-Chu (TW); Jeng Yu, Hsin-Chu (TW)

(73) Assignee: Taiwan Semiconductor Manufacturing Co. Ltd., (TW)

( * ) Notice: Subject to any disclaimer, the term of this patent is extended or adjusted under 35 U.S.C. 154(b) by 109 days.

(21) Appl. No.: 10/666,355

(22) Filed: Sep. 19, 2003

(65) Prior Publication Data

US 2005/0064722 A1    Mar. 24, 2005

(51) Int. Cl.
*H01L 21/302* (2006.01)
(52) U.S. Cl. ............ 438/7; 438/8; 438/9; 438/16; 438/696; 438/704; 438/750
(58) Field of Classification Search ............ 438/7, 438/8, 9, 16, 696, 704, 750
See application file for complete search history.

(56) References Cited

U.S. PATENT DOCUMENTS

| 5,863,824 A | * | 1/1999 | Gardner et al. ............ 438/303 |
| 5,879,998 A | | 3/1999 | Krivokapic ................ 438/300 |
| 5,899,722 A | | 5/1999 | Huang ..................... 438/305 |
| 6,190,961 B1 | * | 2/2001 | Lam et al. ................ 438/253 |
| 6,268,253 B1 | | 7/2001 | Yu ........................ 438/303 |
| 6,492,275 B1 | * | 12/2002 | Riley et al. .............. 438/696 |

* cited by examiner

*Primary Examiner*—George A. Goudreau

(57) ABSTRACT

A method of fabricating final spacers having a target width comprises the following steps. Initial spacers, each having an initial width that is less than the target width, are formed over the opposing side walls of a gate electrode portion. The difference between the initial spacer width and the target width is determined. A second spacer layer having a thickness equal to the determined difference between the initial width of the initial spacers and the target width is formed upon the initial spacers and the structure. The second spacer layer is etched to leave second spacer layer portions extending from the initial spacers to form the final spacers.

39 Claims, 2 Drawing Sheets

METHOD TO CONTROL SPACER WIDTH

FIELD OF THE INVENTION

The present invention relates generally to semiconductor fabrication and more specifically to methods of fabricating side wall spacers.

BACKGROUND OF THE INVENTION

As semiconductor devices shrink to 0.18 μm, 0.15 μm and 0.13 μm design rules and beyond, the side wall spacer width performance is sensitive to electric test parameters such as Isat N(P), Rser (N)P and RS N$^+$P$^+$. This will also affect the wafer acceptance test (WAT) parameters and subsequent silicide formation.

Composite side wall spacer formation is more complex in the etching module and the spacer width is difficult to control with different pattern densities. This results in unstable Isat and/or silicide bridging issues.

U.S. Pat. No. 6,268,253 B1 to Yu describes a removable spacer process.

U.S. Pat. No. 5,899,722 to Huang describes a double spacer process.

U.S. Pat. No. 5,879,998 to Krivokapic describes a short channel device with double spacers.

SUMMARY OF THE INVENTION

Accordingly, it is an object of one or more embodiments of the present invention to provide an improved method of controlling side wall spacer width.

Other objects will appear hereinafter.

It has now been discovered that the above and other objects of the present invention may be accomplished in the following manner. Specifically, a structure having a gate electrode portion formed thereover is provided. The gate electrode portion having a top and opposing side walls. Initial spacers are formed over the opposing side walls of the gate electrode portion. The initial spacers each having an initial width that is less than the target width. The difference between the initial width of the initial spacers and the target width is determined. A second spacer layer is formed upon the initial spacers and the structure. The second spacer layer having a thickness that is equal to the determined difference between the initial width of the initial spacers and the target width. At least the second spacer layer is etched from over the initial spacers and the structure to leave second spacer layer portions extending from the initial spacers to form the final spacers.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

Figure 1:
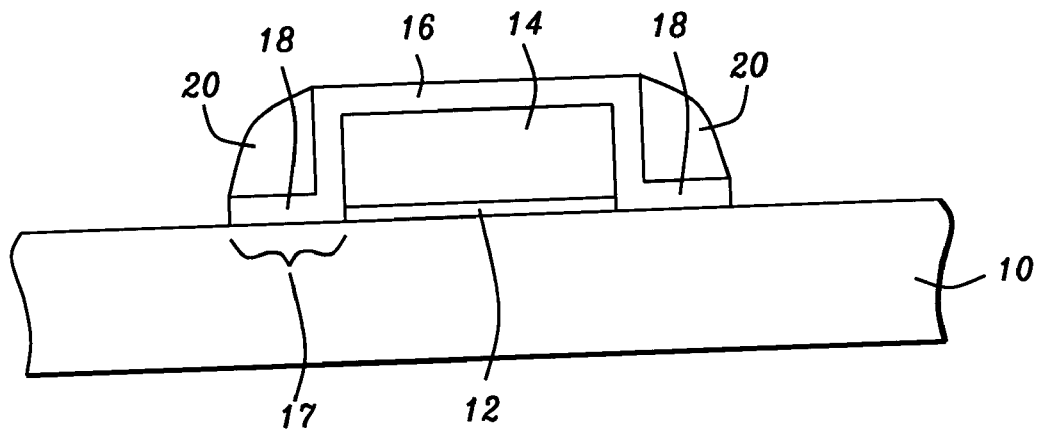
FIGS. 1 to 5 schematically illustrate a preferred embodiment of the present invention.

Initial Structure—FIG. 1

As shown in FIG. 1, a gate electrode portion 14 is formed over structure 10. An underlying gate oxide layer 12 is interposed between gate portion 14 and structure 10. A first spacer layer 16 is formed over the top and sidewalls of gate electrode portion 14 and includes a spacer portion 18 that extends as at 17 from the gate electrode portion 14 sidewalls along the structure 10. Oxide remnants 20, preferably LPTEOS as will be used for purposes of illustration hereafter, cover the sidewall portions of first spacer layer 16 as shown in FIG. 1.

Gate electrode portion 14 has a thickness of preferably from about 1000 to 3000 Å and more preferably from about 1700 to 2300 Å and is preferably comprised of polysilicon (poly).

Gate oxide layer 12 has a thickness of preferably from about 125 to 175 Å, more preferably from about 140 to 160 Å and most preferably about 150 Å and is preferably comprised of low-pressure TEOS (LPTEOS), TEOS, PECVD or SACVD and is more preferably LPTEOS.

Structure 10 is preferably a silicon substrate and is understood to possibly include a semiconductor wafer or substrate.

First spacer layer 16 has a thickness of preferably from about 250 to 350 Å, more preferably from about 280 to 320 Å and most preferably about 300 Å and is preferably comprised of SiN.

It is noted that an optional composite ONO (silicon oxide/silicon nitride/silicon oxide) layer may be formed underneath first spacer layer 16.

Figure 2:
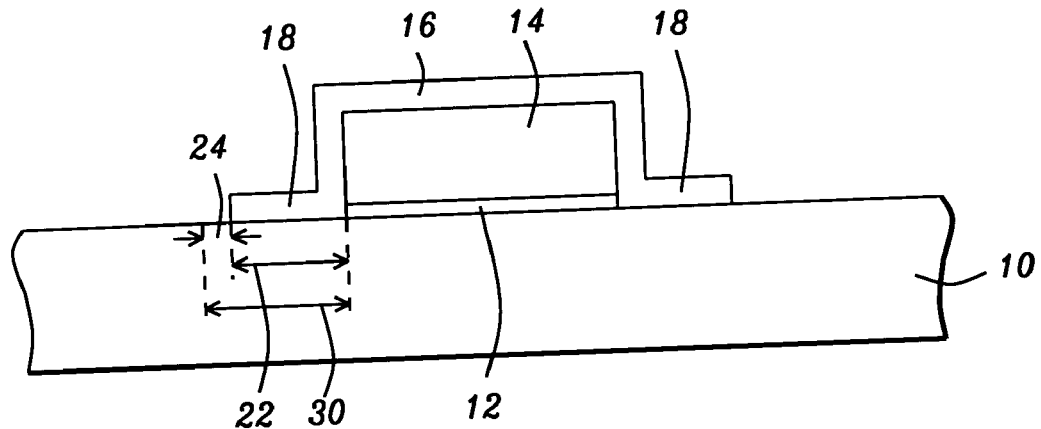

Oxide Wet Dip—FIG. 2

As shown in FIG. 2, an oxide wet dip process removes the LPTEOS remnants 20 from over the gate electrode portion 14.

Feed-Forward

The (initial) width 22 of the spacer portion 18 of the first spacer layer 16 extending as at 17 from the gate electrode portion 14 is determined and compared to the target spacer 32 width 30. As shown in FIG. 2, the initial width 22 is defined by the amount the spacer portion 18 extends away from the gate electrode portion 14. The difference 24 between the target spacer 32 width 30 and the (initial) width 22 of spacer portion 18 is determined and this datum/data is fed-forward to determine the thickness 26 of a second spacer layer 31 as shown in FIG. 3 and described below.

Preferably, the (initial) width 22 of the spacer portion 18 of the first spacer layer 16 is intentionally formed to be less than the target spacer 32 width 30. The ability to precisely control the width 30 of the target/composite spacer 32 is possible through good thickness control of the second spacer layer/second SiN spacer layer 31.

Figure 3:
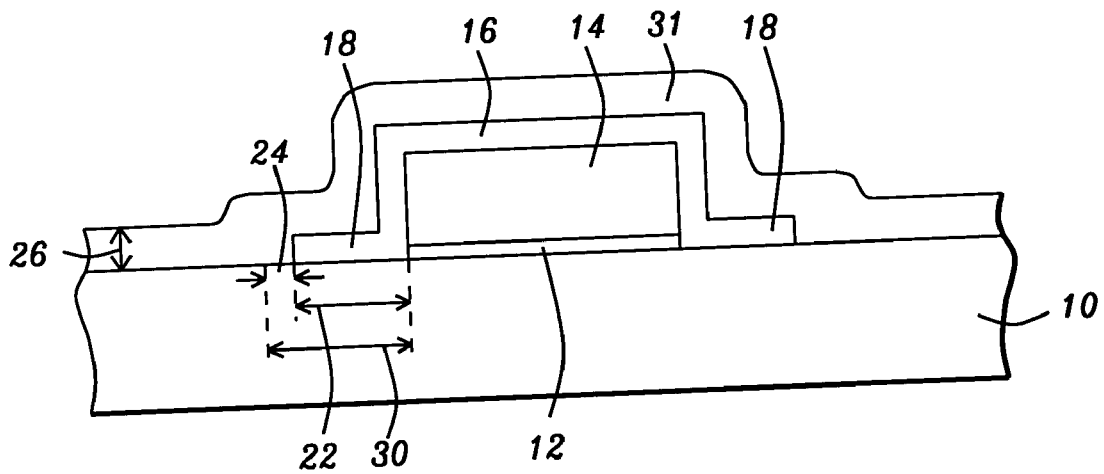

Formation of Second Spacer Layer 31—FIG. 3

As shown in FIG. 3, using this feed-forward datum/data, the difference 24. a second spacer layer 31 is formed over the first spacer layer 16 and the structure 10 so that its thickness 26 that equals the difference 24 between the target spacer 32 width 30 and the (initial) width 22 of spacer portion 18. For example, if the target spacer 32 width 30 is 900 Å(third column), than for the indicated (initial) width 22 of spacer portion 18 of the first spacer layer 16 (second column) as shown in the following table, the thickness 26 of the second spacer layer 31 would be as shown (second column).

| (Initial) Spacer 18 Width 22 | Second Spacer Layer 31 Thickness 26 | Target Spacer 32 Width 30 |
|---|---|---|
| 650 Å | 250 Å | 900 Å |
| 700 Å | 200 Å | 900 Å |
| 750 Å | 150 Å | 900 Å |
| 800 Å | 100 Å | 900 Å |
| 850 Å | 50 Å | 900 Å |

The width 30 of target spacer 32 is preferably from about 100 to 800 Å and more preferably from about 200 to 700 Å. Within these ranges, the WAT parameters (device current ($I_{sat}$), $R_s$) show good performance.

The second spacer layer 31 is preferably comprised of the same material as is the first spacer layer 16 and is preferably SiN.

Figure 4:
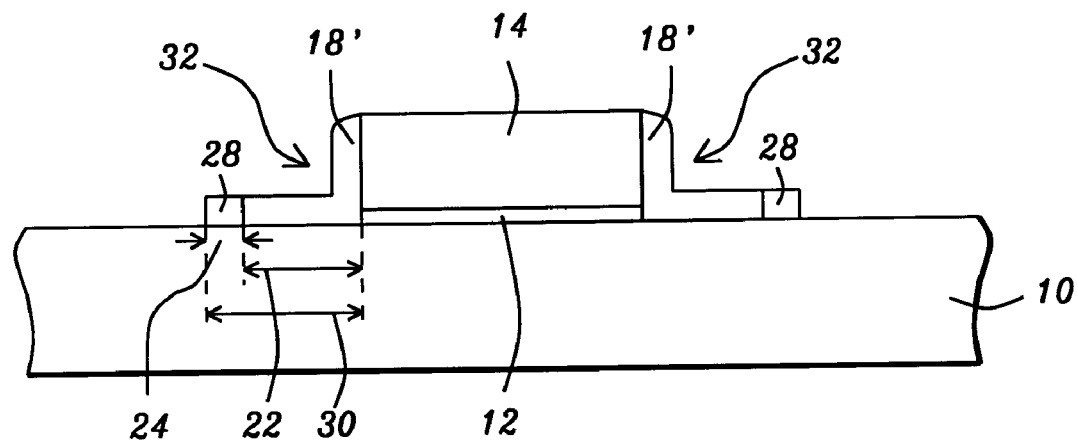

Etching of the Second Spacer Layer 31 to Form the Target Spacer 32—FIG. 4

As shown in FIG. 4, the second spacer layer 31, and the portion of the first spacer layer 16 overlying the top of the gate electrode portion 14, are etched to leave spacer portion 18' and second spacer layer portion 28 extending from spacer portion 18' which combined form final composite spacer 32 having a width 30 equal to the target width 30 as the width 24 of the second spacer layer portion 28 is equivalent to the thickness 26 of the second spacer layer 31. Spacer portion 18' and second spacer layer portion 28 are indistinguishable from each other in forming the final composite spacer 32 if both are comprised of the same material, which is preferred.

Figure 5:
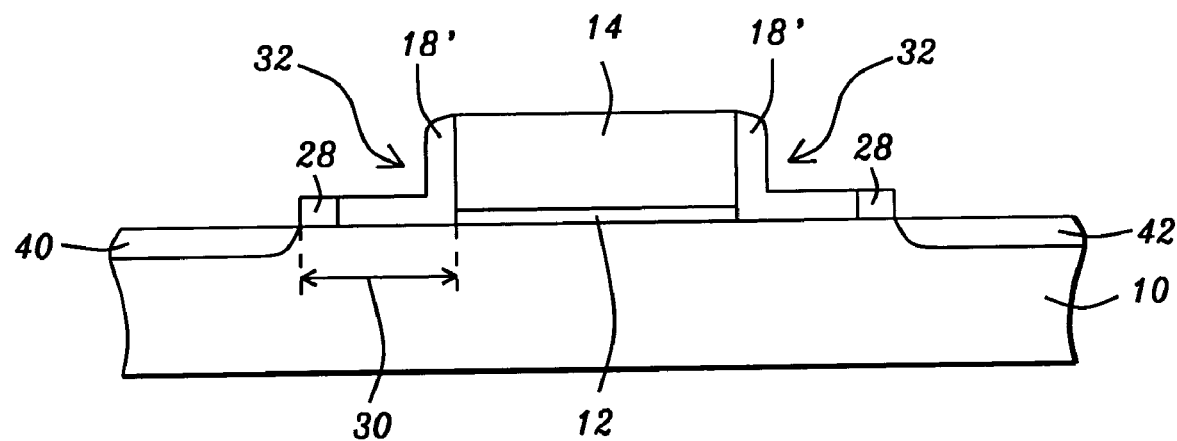

Further Processing—FIG. 5

Further processing may then proceed. For example, as shown in FIG. 5, source and drain implants 40, 42 may be formed within structure 10, outboard of composite spacer 32. By forming composite spacer 32 in accordance with the present invention, the edge of the source and drain implants 40, 42 may be definitely defined.

Respective silicide portions may also be formed over the final spacers 32.

Advantages of the Present Invention

The advantages of one or more embodiments of the present invention include:
1. improved transistor/device electrical performance; and
2. good and stable device current ($I_{sat}$) performance is exhibited.

While particular embodiments of the present invention have been illustrated and described, it is not intended to limit the invention, except as defined by the following claims.

We claim:

1. A method of fabricating final spacers each having a target width, comprising the steps of:
   providing a structure having a gate electrode portion formed thereover; the gate electrode portion having a top and opposing side walls;
   forming initial spacers over the opposing side walls of the gate electrode portion; the initial spacers each having an initial width that is less than the target width, the initial width and the target width being defined by the initial spacers and the final spacers extending along the structure away from the gate electrode portion, respectively;
   determining the difference between the initial width of the initial spacers and the target width;
   forming a second spacer layer upon the initial spacers and the structure, the second spacer layer having a thickness that is equal to the determined difference between the initial width of the initial spacers and the target width; and
   etching at least the second spacer layer from over the initial spacers and the structure leaving second spacer layer portions extending from the initial spacers along the structure forming the final spacers.

2. The method of claim 1, wherein the second spacer layer portions each having a width that is substantially equal to the thickness of the second spacer layer; the width of the second spacer layer portions plus the initial width of the initial spacers being equal to the target width.

3. The method of claim 1, wherein the structure is comprised of silicon.

4. The method of claim 1, wherein the structure is a silicon substrate.

5. The method of claim 1, wherein the gate electrode portion is comprised of polysilicon; the initial spacers are comprised of SiN; and the second spacer layer is comprised of SiN.

6. The method of claim 1, wherein the gate electrode portion has a thickness of from about 1000 to 3000A; and the initial spacers each have a thickness of from about 250 to 350A.

7. The method of claim 1, wherein the gate electrode portion has a thickness of from about 1700 to 2300 Å; and the initial spacers each have a thickness of from about 280 to 320 Å.

8. The method of claim 1, wherein the initial spacers each have a thickness of about 300 Å.

9. The method of claim 1, including the step of forming a gate oxide layer between the structure and the gate electrode portion before the formation of the' initial spacers.

10. The method of claim 1, wherein the initial spacers each include an overlying portion of oxide; and including the a step of:
   removing the overlying portions of oxide by an oxide wet dip process before the formation of the second spacer layer.

11. The method of claim 1, wherein the initial spacers each include an overlying portion of LPTEOS; and including the step of:
   removing the overlying portions of LPTEOS by an oxide wet dip process before the formation of the second spacer layer.

12. The method of claim 1, including the step of forming silicide portions over the final spacers.

13. The method of claim 1, including the step of forming a composite oxide/nitride/oxide layer between the initial spacers and the opposing side walls of the gate electrode portion.

14. A method of fabricating final spacers each having a target width, comprising the steps of:
   providing a structure having a gate electrode portion formed there over; the gate electrode portion having a top and opposing side walls;
   forming initial spacers over the opposing side walls of the gate electrode portion; the initial spacers each having an initial width that is less than the target width, the initial width and the target width being defined by the initial spacers and the final spacers extending along the structure away from the gate electrode portion, respectively;
   determining the difference between the initial width of the initial spacers and the target width;

forming a second spacer layer upon the initial spacers and the structure, the second spacer layer having a thickness that is equal to the determined difference between the initial width of the initial spacers and the target width; and etching at least the second spacer layer from over the initial spacers and the structure leaving second spacer layer portions extending from the initial spacers along the structure forming the final spacers; wherein the second spacer layer portions each having a width that is substantially equal to the thickness of the second spacer layer; the width of the second spacer layer portions plus the initial width of the initial spacers being equal to the target width.

15. The method of claim 14, wherein the structure is comprised of silicon.

16. The method of claim 14, wherein the structure is a silicon substrate.

17. The method of claim 14, wherein the gate electrode portion has a thickness of from about 1000 to 3000 Å; and the initial spacers each have a thickness of from about 250 to 350 Å.

18. The method of claim 14, wherein the gate electrode portion has a thickness of from about 1700 to 2300 Å; and the initial spacers each have a thickness of from about 280 to 320 Å.

19. The method of claim 14, wherein the initial spacers each have a thickness of about 300 Å.

20. The method of claim 14, including the step of forming a gate oxide layer between the structure and the gate electrode portion before the formation of the initial spacers.

21. The method of claim 14, including the step of forming a gate oxide layer between the structure and the gate electrode portion before the formation of the initial spacers; the gate oxide layer being comprised of LPTEOS, TEOS, PECVD or SAC VD.

22. The method of claim 14, wherein the initial spacers each include an overlying portion of oxide; and including the step of:

removing the overlying portions of oxide by an oxide wet dip process before the formation of the second spacer layer.

23. The method of claim 14, wherein the initial spacers each include an overlying portion of LPTEOS; and including the step of:

removing the overlying portions of LPTEOS by an oxide wet dip process before the formation of the second spacer layer.

24. The method of claim 14, including the step of forming silicide portions over the final spacers.

25. The method of claim 14, including the step of forming a composite oxide/nitride/oxide layer between the initial spacers and the opposing side walls of the gate electrode portion.

26. A method of fabricating final spacers each having a target width, comprising the steps of:

providing a structure having a gate electrode portion formed there over; the gate electrode portion having a top and opposing side walls; the gate electrode portion being comprised of polysilicon;

forming initial spacers over the opposing side walls of the gate electrode portion; the initial spacers each having an initial width that is less than the target width; the initial spacers being comprised of SiN;

determining the difference between the initial width of the initial spacers and the target width;

forming a second spacer layer upon the initial spacers and the structure, the second spacer layer having a thickness that is equal to the determined difference between the initial width of the initial spacers and the target width; the second spacer layer being comprised of SiN; and etching at least the second spacer layer from over the initial spacers and the structure to leave second spacer layer portions extending from the initial spacers to form the final spacers; wherein the second spacer layer portions each having a width that is substantially equal to the thickness of the second spacer layer; the width of the second spacer layer portions plus the initial width of the initial spacers being equal to the target width.

27. The method of claim 26, wherein the structure is comprised of silicon.

28. The method of claim 26, wherein the structure is a silicon substrate.

29. The method of claim 26, wherein the gate electrode portion is comprised of polysilicon; the initial spacers are comprised of SiN; and the second spacer layer is comprised of SiN.

30. The method of claim 26, wherein the gate electrode portion has a thickness of from about 1000 to 3000 Å; and the initial spacers each have a thickness of from about 250 to 350 Å.

31. The method of claim 26, wherein the gate electrode portion has a thickness of from about 1700 to 2300 Å; and the initial spacers each have a thickness of from about 280 to 320 Å.

32. The method of claim 26, wherein the initial spacers each have a thickness of about 300 Å.

33. The method of claim 26, including the step of forming a gate oxide layer between the structure and the gate electrode portion before the formation of the initial spacers.

34. The method of claim 26, including the step of forming a gate oxide layer between the structure and the gate electrode portion before the formation of the initial spacers; the gate oxide layer being comprised of LPTEOS, TEOS, PECVD or SACVD.

35. The method of claim 26, including the step of forming a gate oxide layer between the structure and the gate electrode portion before the formation of the initial spacers; the gate oxide layer being comprised of LPTEOS.

36. The method of claim 26, wherein the initial spacers each include an overlying portion of oxide; and including the step of:

removing the overlying portions of oxide by an oxide wet dip process before the formation of the second spacer layer.

37. The method of claim 26, wherein the initial spacers each include an overlying portion of LPTEOS; and including the step of:

removing the overlying portions of LPTEOS by an oxide wet dip process before the formation of the second spacer layer.

38. The method of claim 26, including the step of forming silicide portions over the final spacers.

39. The method of claim 26, including the step of forming a composite oxide/nitride/oxide layer between the initial spacers and the opposing side walls of the gate electrode portion.

* * * * *

UNITED STATES PATENT AND TRADEMARK OFFICE
CERTIFICATE OF CORRECTION

PATENT NO.         : 7,001,784 B2                                          Page 1 of 1
APPLICATION NO. : 10/666355
DATED              : February 21, 2006
INVENTOR(S)        : Jyh-Shiou Hsu, Pin-Yi Hsin and Jeng Yu It is certified that error appears in the above-identified patent and that said Letters Patent is hereby corrected as shown below:

Column 4, line 1, delete "spacerlayer" and insert therefore -- spacer layer --.

Column 5, line 36, delete "SAC VD" and insert therefore -- SACVD --.

Signed and Sealed this

Tenth Day of July, 2007

JON W. DUDAS
*Director of the United States Patent and Trademark Office*